(12) United States Patent
Kawai

(10) Patent No.: US 10,734,170 B2
(45) Date of Patent: Aug. 4, 2020

(54) RESIN STRUCTURE, ELECTRONIC DEVICE, AND METHOD OF MANUFACTURING RESIN STRUCTURE

(71) Applicant: OMRON Corporation, Kyoto-shi, Kyoto (JP)

(72) Inventor: Wakahiro Kawai, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 16/334,076

(22) PCT Filed: Sep. 19, 2017

(86) PCT No.: PCT/JP2017/033673
§ 371 (c)(1),
(2) Date: Mar. 18, 2019

(87) PCT Pub. No.: WO2018/070191
PCT Pub. Date: Apr. 19, 2018

(65) Prior Publication Data
US 2019/0362912 A1    Nov. 28, 2019

(30) Foreign Application Priority Data

Oct. 14, 2016  (JP) ................................ 2016-202421

(51) Int. Cl.
*H05K 1/18* (2006.01)
*H01H 9/02* (2006.01)
(Continued)

(52) U.S. Cl.
CPC ............ *H01H 9/0271* (2013.01); *H01H 1/20* (2013.01); *H01H 1/5805* (2013.01);
(Continued)

(58) Field of Classification Search
USPC ........................................................ 361/761
See application file for complete search history.

(56) References Cited

U.S. PATENT DOCUMENTS 3,830,991 A    8/1974  Durocher
5,898,147 A    4/1999  Domzalski et al.
(Continued)

FOREIGN PATENT DOCUMENTS

CH    689766 A5    10/1999
CN    101652260 A    2/2010
(Continued)

OTHER PUBLICATIONS

Extended European search report dated Nov. 22, 2019 in a counterpart European patent application.
(Continued)

*Primary Examiner* — Andargie M Aychillhum
(74) *Attorney, Agent, or Firm* — Metrolex IP Law Group, PLLC

(57) ABSTRACT

A resin structure includes a molded resin element and a push-type switch. The push-type switch includes a receptacle whereon a first terminal and a second terminal are secured, the first terminal and the second terminal configured to connect to an electrical circuit; a button unit protruding from the receptacle; and a contact spring unit configured to move with the button unit, to electrically connect between the first terminal and the second terminal, and to generate an opposing force relative to a pressure applied between the receptacle and the button unit. The receptacle stores the button unit and the contact spring unit. The receptacle of the push-type switch is embedded in the molded resin element with the button unit exposed from the molded resin element.

7 Claims, 5 Drawing Sheets

(51) Int. Cl.
*H01H 1/20* (2006.01)
*H01H 1/58* (2006.01)
*H01H 11/00* (2006.01)
*H01H 3/04* (2006.01)
*H01H 3/12* (2006.01)

(52) U.S. Cl.
CPC ............ *H01H 11/00* (2013.01); *H05K 1/185* (2013.01); *H01H 3/04* (2013.01); *H01H 3/12* (2013.01); *H01H 2009/0285* (2013.01); *H01H 2229/044* (2013.01); *H01H 2239/058* (2013.01); *H05K 2201/10037* (2013.01); *H05K 2201/10053* (2013.01)

(56) References Cited

U.S. PATENT DOCUMENTS

| | | | |
|---|---|---|---|
| 2010/0027225 A1* | 2/2010 | Ieki | H05K 1/0218 361/761 |
| 2010/0104803 A1 | 4/2010 | Nakagawa et al. | |
| 2011/0204146 A1 | 8/2011 | Tatai et al. | |
| 2012/0228109 A1 | 9/2012 | Wang et al. | |
| 2012/0300404 A1 | 11/2012 | Arimai et al. | |
| 2014/0232527 A1 | 8/2014 | Mulzer et al. | |
| 2014/0293560 A1* | 10/2014 | Lee | H05K 1/185 361/761 |
| 2016/0192514 A1 | 6/2016 | Takizawa et al. | |
| 2016/0219712 A1 | 7/2016 | Ko et al. | |

FOREIGN PATENT DOCUMENTS

| | | |
|---|---|---|
| CN | 102197451 A | 9/2011 |
| CN | 102800659 A | 11/2012 |
| CN | 103996551 A | 8/2014 |
| CN | 104112948 A | 10/2014 |
| CN | 105655175 A | 6/2016 |
| CN | 105744769 A | 7/2016 |
| JP | S55-021391 U | 2/1980 |
| JP | H05-135651 A | 6/1993 |
| JP | H06-349377 A | 12/1994 |
| JP | H11-162286 A | 6/1999 |
| JP | 2003-165357 A | 6/2003 |
| JP | 2007-305469 A | 11/2007 |

OTHER PUBLICATIONS

English translation of the International Search Report("ISR") of PCT/JP2017/033673 dated Dec. 26, 2017.
Written Opinion("WO") of PCT/JP2017/033673 dated Dec. 26, 2017.
Chinese Office Action (CNOA) dated Aug. 26, 2019 in a counterpart Chinese patent application.

* cited by examiner

RESIN STRUCTURE, ELECTRONIC DEVICE, AND METHOD OF MANUFACTURING RESIN STRUCTURE

FIELD

The present invention relates generally to a resin structure, an electronic device, and a method of manufacturing a resin structure. More specifically, the present invention relates to a package structure for the push-type switch that provides a click sensation when operated, and a method of manufacturing the package structure. The package structure is suitable for manufacturing an electronic device wherein the push-type switch is assembled with another electronic device.

BACKGROUND

A push-type switch may be used as a component that is made up of an electrical circuit. The push-type switch must provide a user with a sense of operating the device (a click sensation). The advantage is that provide a user with a sense of operating the device allows the user to reliably recognize having pressed a switch. For instance, a tactile switch is one such type of switch.

The push-type switch is typically placed on a printed substrate that holds an electrical circuit; the push-type switch is for accepting an operation from a person and entering a signal into the electrical circuit. FIG. 13 is a top view for describing the typical package structure of a push-type switch; and FIG. 14 is a cross-sectional view of the cross-section XIV-XIV in the package structure depicted in FIG. 13.

Referring to FIG. 13 and FIG. 14, the push-type switch 100 may be connected to another electronic component by soldering a connection 210 onto the printed circuit board 200 on which the relevant electronic component is mounted (not shown). The connection 210 connects terminals 110, 111 and the conductive circuitry 201 on the printed circuit board.

The electronic device that uses the push-type switch 100 is further processed by assembling the printed circuit board 200 and a resin structure 320 provided with a hole 321 that can accommodate the push-type switch 100 internally; and a sheet 310 is bonded over the upper surface of the resin structure 320 to cover the hole 321.

Incidentally, an electronic device thus configured is larger because the storage space (i.e., the hole 321) into which the push-type switch 100 is mounted must be wider; the manufacturing cost increases because the manufacturing process is more complicated since the sheet material 310 must be bonded to cover the storage space; or the electronic device loses its design flexibility. Finally, despite recent demand for thinner and more compact portable devices, the ability to provide these features has limitations since the printed substrate is used when assembling the push-type button switch with other electronic components For instance, Japanese Patent Publication 2003-165357 (FIG. 3B) proposes embedding the mechanical operational structure of the push-type switch into a resin structure as a means of either omitting the switch storage space, or the sheet material on the outer surface.

RELATED ART DOCUMENTS

Patent Documents

[Patent Document 1] Japanese Patent Publication 2003-165357 (FIG. 3B)
[Patent Document 2] Japanese Patent Publication H6-349377 (FIG. 3A)

SUMMARY

Technical Problem

Incidentally, J P 2003-165357 A provides no discussion in terms of the proposed method, on a means of assembling the push-type switch with another related component. If an existing printed substrate is used for configuring the electronic device, the assembly structure instead becomes more complicated.

Moreover, the drive unit (button unit) for the push-type switch is embedded in an elastic resin such as a polyester elastomer in the device proposed by Japanese Patent Publication H6-349377 (FIG. 3A); JP H6-349377 further proposes a switch structure where the conductive part provided at tip end of the button unit allows electrical conduction to the conduction circuit provided on the printed substrate.

Incidentally, the switch structure proposed in said existing technology is problematic in that no click sensation is produced when the button unit is pressed, i.e., during the switching. Another issue is the increased manufacturing cost which is due to the need to align the conduction circuit provided on the printed substrate and the button unit circuitry. The printed substrate also remains an impediment to resolving the problem of providing a thinner profile.

In light of the foregoing problems in the above-mentioned existing technology, the present invention provides for a compact, thin, electronic device that uses a push-type switch that provides a click sensation when pressed, which can be manufactured at low cost.

Solution to Problem

In summary, the present invention is a resin structure including a molded resin element and a push-type switch. The push-type switch includes a first terminal and a second terminal configured to connect to an electrical circuit; a receptacle whereon the first terminal and the second terminal are secured; a button unit protruding from the receptacle; and a contact spring unit configured to move with the button unit, to electrically connect between the first terminal and the second terminal, and to generate an opposing force relative to a pressure applied between the receptacle and the button unit; the receptacle configured to store the button unit and the contact spring unit; and the receptacle of the push-type switch embedded in the molded resin element with the button unit exposed from the molded resin element.

Preferably the molded resin element may be composed of an elastic material.

More preferably, the resin structure includes a first outer surface where from the button unit is exposed, and a second outer surface facing the first outer surface; and the resin structure elastically deforms when the receptacle receives pressure from the second outer surface causing the receptacle to move from the second outer surface toward the first outer surface.

The receptacle may be embedded in the molded resin element so that the button unit is receded from the first outer surface which surrounds the button unit in the molded resin element.

The molded resin element may include a beam structure and a support supporting the beam structure. The push-type switch may be embedded in the beam structure of the molded resin element.

The resin structure may further include: an electronic component embedded in the molded resin element and configured for electrically connecting to the push-type switch; and a conductive wiring pattern formed on the outer surface of the molded resin element and configured to connect the electrical component and the first terminal.

In another aspect of the present invention an electronic device is provided with the above-mentioned resin structure, and a contacting part placed at the first outer surface of the molded resin element; and the molded resin element is configured to deform so that the button unit touches the contacting part when the receptacle receives pressure from the second outer surface.

The contacting part may be a battery.

Another aspect of the present invention provides for a method of manufacturing a resin structure with a push-type switch embedded in a molded resin element; The push-type switch includes a first terminal and a second terminal configured to connect to an electrical circuit; a receptacle whereon the first terminal and the second terminal are secured; a button unit protruding from the receptacle; and a contact spring unit configured to move with the button unit, to electrically connect between the first terminal and the second terminal, and to generate an opposing force relative to a pressure applied between the receptacle and the button unit; the receptacle configured to store the button unit and the contact spring unit; and the method of manufacturing the resin structure includes: placing the push-type switch in a mold with the mold pressing the button unit of the push-type switch toward the receptacle so that the button unit is separate from a cavity when the cavity is filled with resin; and injecting a resin into the cavity in the mold.

Effects

The present invention provides for a resin structure with a built-in switch where the resin structure establishes an operational feel for the switch and contributes to a compact and thin electronic device.

DETAILED DESCRIPTION

Figure 1:
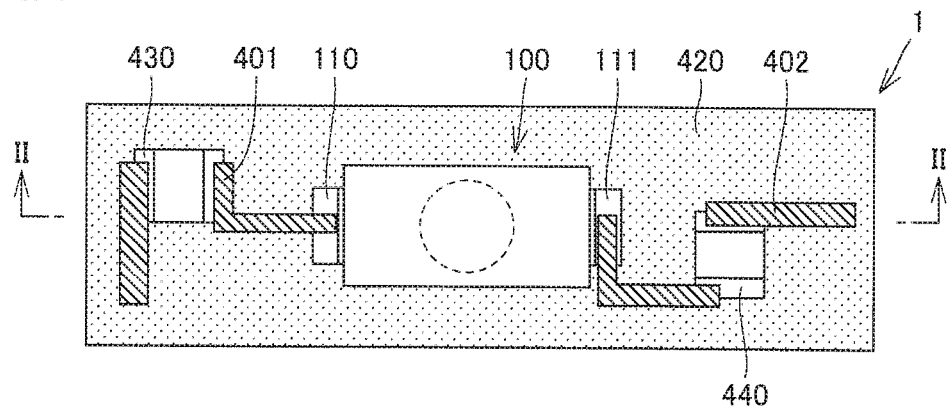
FIG. 1 is a plan view illustrating a configuration of a resin structure according to a first embodiment.

Embodiments of the present invention are described in detail with reference to the drawings. The same or corresponding elements within the drawings are given the same reference numerals and the explanations therefor are not be repeated.

First Embodiment

Figure 2:
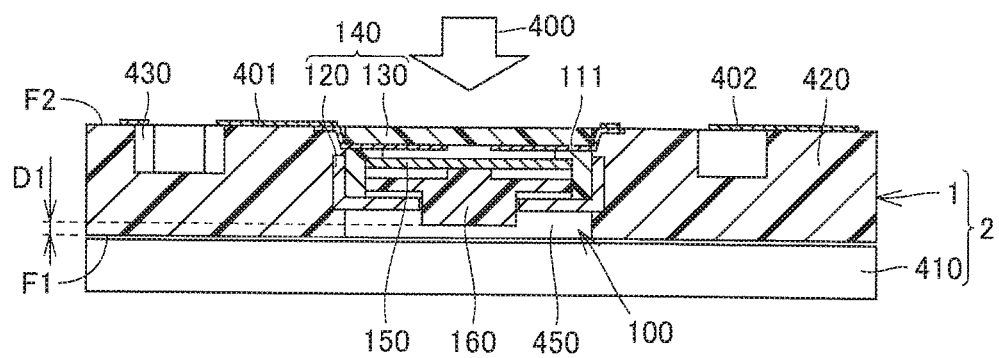
FIG. 2 is a cross-sectional view along a cross section II-II in FIG. 1.

FIG. 1 is a plan view illustrating a configuration of a resin structure according to a first embodiment; and FIG. 2 is a cross-sectional view along a cross section II-II in FIG. 1.

Referring to FIG. 1 and FIG. 2, the resin structure 1 is provided with a molded resin element 420, a push-type switch 100, and electronic components 430, 440. The push-type switch 100 is embedded in the molded resin elements 420 along with the electronic components 430, 440. The molded resin element 420 is an elastic material in the first embodiment, e.g., an elastomer that can be an injection molded component.

Figure 3:
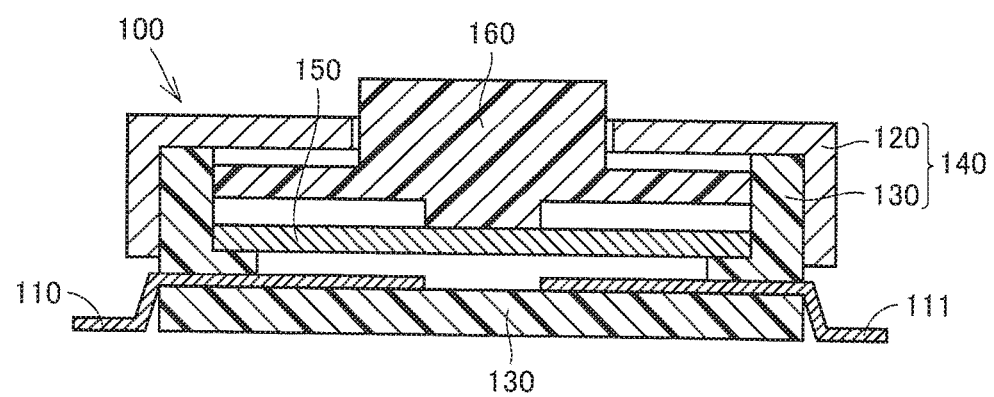
FIG. 3 is a cross-sectional view illustrating a configuration of a push type switch 100 embedded in the resin structure 1.

FIG. 3 is a cross-sectional view illustrating a configuration of a push type switch 100 embedded in the resin structure 1. Referring to FIG. 3, the push-type switch 100 includes a first terminal 110 and a second terminal 111, a receptacle 140, a button unit 160, and a contact spring Unit 150.

The receptacle 140 includes a base 130 and a cover 120. The first terminal 110 and the second terminal 111 are secured to the base 130 of the receptacle 140. The button unit 160 protrudes from the cover 120 of the receptacle 140 when not subject to pressure. The receptacle 140 houses the button unit 160 and the contact spring unit 150. The inner end parts of the first terminal 110 and the second terminal 111 are exposed as fixed contacts on the base 130 at the bottom of the storage space; the contact spring unit 150 operates as a movable contact. The cover 120 covers the base 130 from opposite the first terminal 110 and the second terminal 111 so that the button unit 160 and the contact spring unit 150 do not escape from the base 130.

The contact spring unit 150 may be a metallic leaf spring, and configured to move with the button unit 160. The contact spring unit 150 may be curved with the convex portion toward slightly toward the button unit 160 to provide a click sensation when the button is pressed. The contact spring unit 150 electrically connects between the first terminal 110 and the second terminal 111 when the button unit is pressed and the bottom surface of the base 130 warps into a convex surface; additionally, the contact spring unit 150 is configured to generate an opposing force relative to the pressure 400 added between the base 130 and the button unit 160.

Again with reference to FIG. 1, FIG. 2, and FIG. 3 the first terminal 110 and the second terminal 111 are connected to the electrical circuits at the outer surface of the molded resin element. The base 130 of the push-type switch 100 is embedded in the molded resin element 420 with the button unit 160 exposed from the molded resin element 420.

The resin structure 1 further includes: an electronic component 430 that is embedded in the molded resin element 420 and can be electrically connected to the push-type switch 100; and a conductive wiring pattern 401 formed on the outer surface of the molded resin element 420 and connecting the electronic component and the first terminal 110.

How the push-type switch 100 in the resin structure 1 thus configured creates a connection when pressure is added is described.

Figure 4:
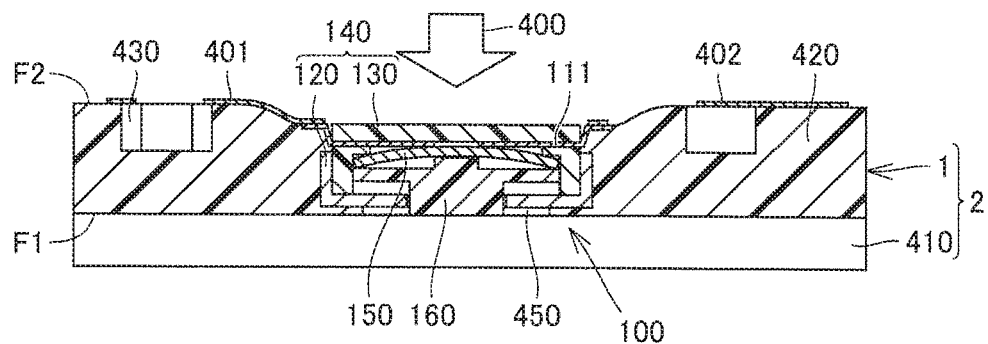
FIG. 4 is a cross-sectional view illustrating the deformation in the enclosure surrounding the push-type switch 100 when pressure is added to the resin structure 1.

FIG. 4 is a cross-sectional view illustrating the deformation in the enclosure surrounding the push-type switch 100 when pressure is added to the resin structure 1.

Referring to FIG. 2 and FIG. 4 the resin structure 1 includes a first outer surface F1 and a second outer surface F2 that faces the first outer surface F1; the button unit 160 is exposed from the first outer surface F1. The base 130 is placed closer to the second outer surface F2 than the button unit 160 in the resin structure 1. The molded resin element 420 elastically deforms when the base 130 receives pressure 400 from the second outer surface F2, which causes the base 130 to move from the second outer surface F2 toward the first outer surface F1.

An electronic device 2 is provided with the resin structure 1, and a contacting part 410 placed at the first outer surface F1 of the molded resin element. The contacting part 410 may be a battery, or another component such as an enclosure. However, the contacting part 410 is preferably of a material that has a lower elasticity than the molded resin element 420. The molded resin element 420 deforms so that the button unit 160 touches the contacting part 410 when the base 130 receives a pressure 400 from second outer surface F2 as illustrated in FIG. 4. The molded resin element 420 returns to the shape illustrated in FIG. 2 when the pressure 400 is removed.

The base 130 is embedded in the molded resin element 420 so that with no pressure 400 applied, the button unit 160 is receded to a depth D1 from the first outer surface F1 which surrounds the button unit 160 in the molded resin element 420. The depth D1 is established to provide the most suitable click sensation and to ensure that the push-type switch 100 is not subject to an excessive force.

A method of manufacturing the resin structure 1 is described next with reference to the cross-sectional view in FIG. 2 and the manufacturing processes depicted in FIG. 5 through FIG. 9.

Referring to FIG. 2, the push-type switch 100 which is configured to provide a click sensation when the button unit 160 is pressed, is embedded in the molded resin element 420 of the resin structure 1 which is flexible and made of a polyester elastomer or the like. More specifically, the push-type switch 100 is embedded with the button unit 160 receded roughly 0.5 mm from the surface of the molded resin element 420, creating a step of a depth D1.

The push-type switch 100 is wired with the conductive wiring patterns 401, 402 and connected to related components through the terminals 110, 111. The push-type switch 100 provides electrical switching between the conductive wiring pattern 401 and conductive wiring pattern 402, which contain silver nano-ink or the like, and are provided on the outer surface of the molded resin element. The related components, which are also embedded in the molded resin element 420 may be electronic components 430, 440 in a chip component such as a resistor, a capacitor, or the like.

Figure 5:
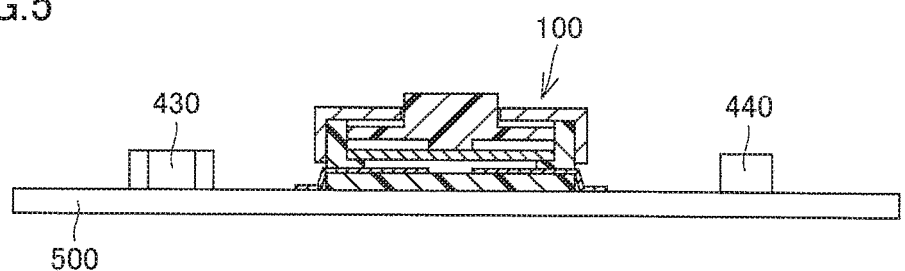
FIG. 5 is a first cross-sectional view for describing the manufacturing process.

FIG. 5 is the first drawing for describing the manufacturing process.

Step A

The terminals 110, 111 of the push-type switch 100 and the electrodes of the electronic components 430, 4404 related components may be secured in contact with a temporary fixing film 500 using an adhesive agent. For example, polyethylene terephthalate (PET) film may be used as the temporary fixing film 500.

At this point, the components may be adhered with the adhesive agent coated on the temporary fixing film 500. For example fixing may occur using an ultraviolet curable adhesive agent (not shown). More specifically, 2 to 3 μm of an adhesive agent may be coated onto of 50 μm of a PET temporary fixing sheet. The electronic components are positioned and placed; the adhesive agent is irradiated with ultraviolet light of 3000 mJ/cm$^2$ and thus cured; herewith, an LED is secured to the temporary fixing film.

Figure 6:
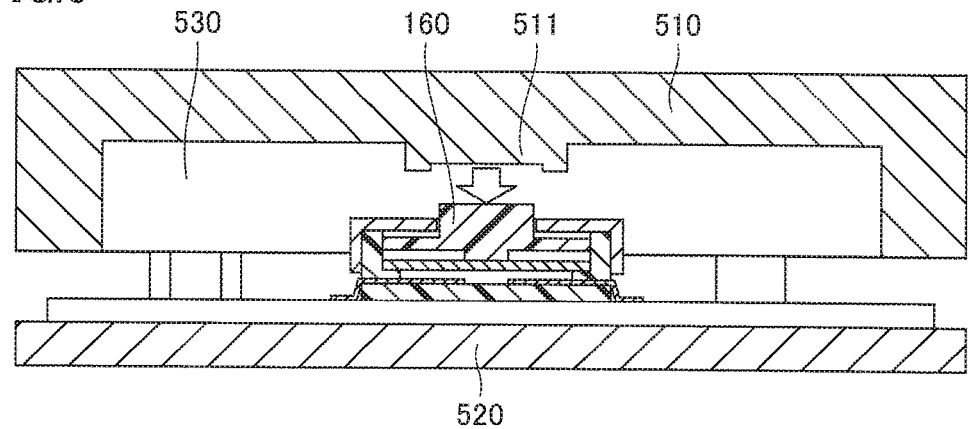
FIG. 6 is a second cross-sectional view for describing the manufacturing process.

FIG. 6 is the second drawing for describing the manufacturing process.

Step B

Next, the temporary fixing film 500 on which the electronic components are temporarily secured in Step A, is placed in a cavity 530 (hollow) inside molds 510, 520. At this point, the temporary fixing film 500 is placed in the cavity 530 so that the button unit 160 of the push-type switch 100 is positioned at a protrusion 511 in the cavity 530; the protrusion 511 is for creating the step in the molded resin element. The height of the protrusion 511 is established with the amount of protrusion of the button unit 160 in mind; more specifically, the height of the protrusion 511 may be a value defined by the height difference between the outer surface of the molded resin element and the apex of the button unit 160, e.g., 0.5 mm.

Figure 7:
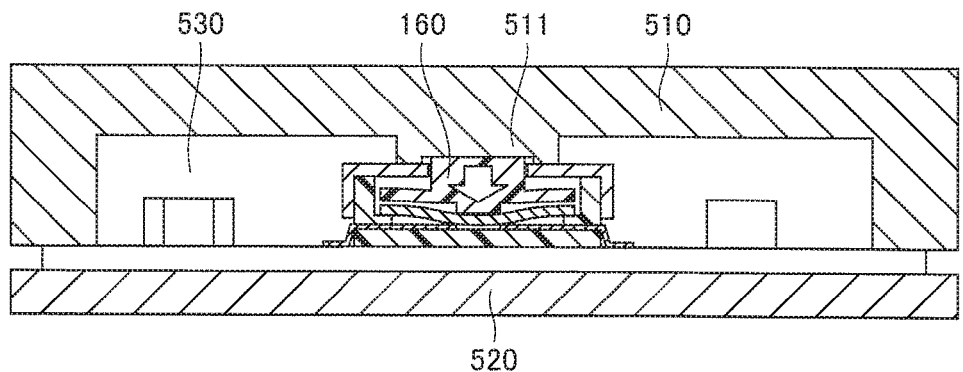
FIG. 7 is a third cross-sectional view for describing the manufacturing process.

FIG. 7 is the third drawing for describing the manufacturing process. As illustrated in FIG. 7, in Step B the push-type switch 100 is placed between molds 510, 520 while the protrusion 511 in the mold 510 presses the button unit 160 of the push-type switch 100 toward the base 130 so that the button unit 160 is separated from the cavity 530 when the cavity 530 is filled with resin.

Step C

Next, an epoxy elastomer, or the like is shot into the cavity 530 at a resin temperature of 270° C. and a pressure of 100 MPa with the components as depicted in FIG. 7 to create the molded resin element with the electronic components embedded therein. At this point, the protrusion 511 in the cavity is pressing against the button unit 160 of the push-type switch 100 in the direction of the arrow. However, the push-type switch 100 does not break as long as the height of the recess the button unit 160 touches due to the pressure from the protrusion 511 is very near the amount the button unit 160 is to protrude from the switch body.

Figure 8:
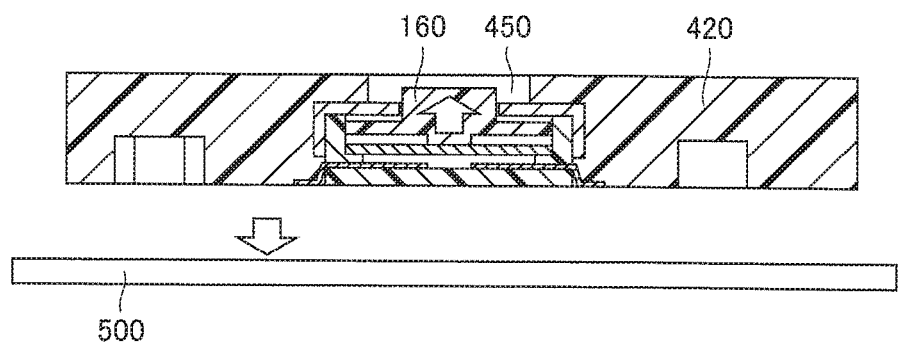
FIG. 8 is a fourth cross-sectional view for describing the manufacturing process.

FIG. 8 is the fourth drawing for describing the manufacturing process.

Step D

The molded resin element 420 formed in Step C is extracted from the cavity 530; and, as illustrated in FIG. 8, the temporary fixing film 500 is removed from the molded resin element 420. The terminals 110, 111 of the push-type switch 100 and the connection electrodes of the electronic components are thus exposed from the outer surface of the molded resin element 420.

At this stage, without the protrusion 511 of the mold, the contact spring unit 150 in the push-type switch 100 returns the button unit 160 in the push-type switch 100 in the direction of the arrow; the button unit 160 is inside a recess 450 created inside the molded resin element 420. Here, the button unit 160 is receded a prescribed value below the outer surface of the molded resin element 420, e.g., 0.5 mm.

Figure 9:
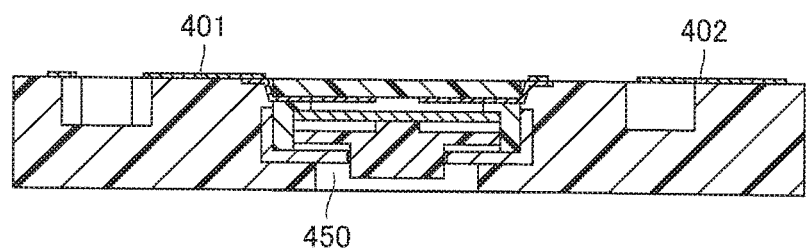
FIG. 9 is a fifth cross-sectional view for describing the manufacturing process.

FIG. 9 is the fifth drawing for describing the manufacturing process.

Step E

Finally, the terminals of the push-type switch 100, which are exposed from the outer surface of the molded resin element, and the connection electrodes of the electronic components 430, 440 are connected via the conductive wiring patterns 401, 402 as illustrated in FIG. 9, and the resin structure 1 according to the embodiment is thus complete. At this point conductive wiring patterns 401, 402 may be produced by using an ink-jet printer to inject and print a conductive material (e.g., silver ink); using an aerosol method; or using a dispenser.

The embedded structure of a switch of the above-described embodiment allows conduction between circuits (the conductive wiring patterns 401, 402) on the outer surface of the molded resin element 420. More specifically, when the push-type switch 100 embedded in the molded resin element 420 is pressed in the direction of the pressure 400, the flexible molded resin element 420 made of elastomer deforms until the button unit 160 touches and presses into a contacting part 410 secured to a battery or the like, thus creating a connection between the circuits on the outer surface of the molded resin element 420. At this point the amount the molded resin element deforms varies depending on the height of the protrusion 511 inside the cavity in FIG. 7. This height, that is, the difference in height between the apex of the button unit 160 and the outer surface of the molded resin element determines the operating feel of the switch.

One feature of the resin structure 1 of this embodiment is that the switch may be activated by pressing from the terminal side (terminal 110, 111) of the push-type switch 100. That is, unlike a typical switch where the button unit 160 is pressed, this push-type switch can be activated by the pressure from the wired side of the printed substrate or the like.

In other words, as described with reference to FIG. 4, when the push-type switch 100 is pressed from the direction of the pressure 400, the base 130 of the push-type switch 100 travels in the direction it is pressed with the deformation of the flexible molded resin element 420 into which it is embedded, and the button unit 160 touches and presses against the contacting part 410. The electrical conduction between the terminal 110 and the terminal 111 may thus be activated or deactivated.

The resin structure 1 of the first embodiment provides the following effects (1) through (3) in terms of compactness, and thinness of the electronic device.

(1) The resin structure provides the same click sensation as that of a typical push-type switch since the button unit 160 and the contact spring unit 150 are pressed in at the same time.

(2) There is no need to create a space for a hole 321 or the like (FIG. 14) in the mold to embed the push-type switch 100 in the molded resin element 420.

(3) No other materials, such as a printed substrate, are needed for connecting the push-type switch 100 and other related components during assembly.

The following kinds of effects (4) and (5) are also present.

(4) The resin structure provides a better design because the side of the resin structure that is subject to the pressure 400 during switching has no recess or projection, i.e., is it is a flat surface.

Figure 14:
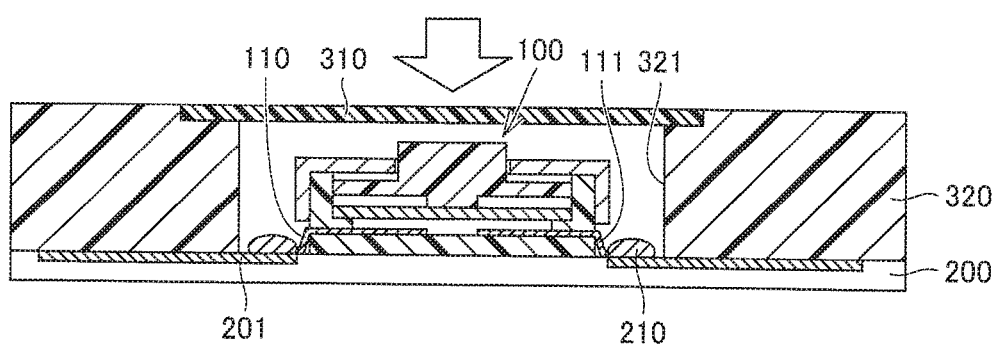
FIG. 14 is a cross-sectional view along the cross section XIV-XIV in the package structure depicted in FIG. 13.

(5) The typical push-type switch is structured with an internal space as illustrated in FIG. 14; therefore, a resin material or the like must be added around the element to seal it against moisture or water. However, the push-type switch 100 is embedded into a molded resin element 420 in the resin structure 1 according to the embodiment. The molded resin element 420 also acts as a seal, removing the need for a seal as is the case with conventional structures.

Second Embodiment

The first embodiment describes using the highly elastic polyester elastomer for the molded resin element wherein the push-type switch 100 is embedded; however, a case where a material with a lower elasticity than polyester elastomer is used, such as a polycarbonate (PC) or acrylonitrile-butadiene-styrene (ABS), is described.

Figure 10:
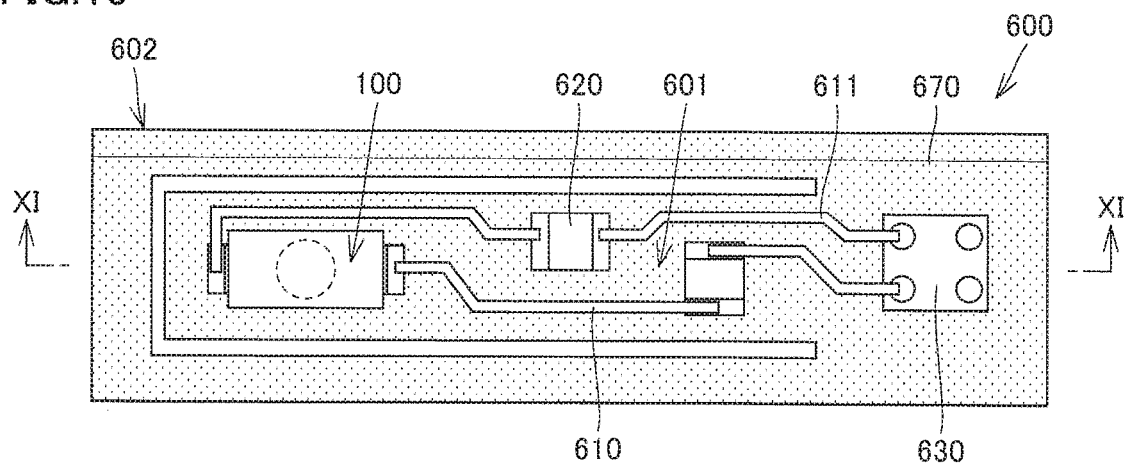
FIG. 10 is a plan view illustrating a configuration of a resin structure according to a second embodiment.
Figure 11:
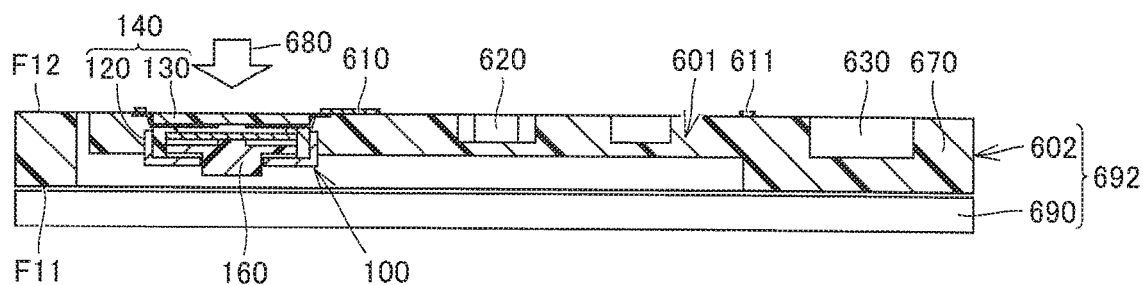
FIG. 11 is a cross-sectional view along the cross section XI-XI in FIG. 10.

FIG. 10 is a plan view illustrating a configuration of a resin structure according to a second embodiment; and FIG. 11 is a cross-sectional view along the cross section XI-XI in FIG. 10.

Referring to FIG. 10 and FIG. 11, the resin structure 600 is provided with a molded resin element 670, the push-type switch 100, and electronic components 620, 630. The push-type switch 100 is embedded in the molded resin elements 670 along with the electronic components 620, 630.

The molded resin element 670 includes a beam structure 601, and a support 602 supporting the beam structure 601. The push-type switch 100 is embedded in the beam structure 601 of the molded resin element 670. The base 130 of the push-type switch 100 is embedded in the molded resin element 670 with the button unit 160 exposed therefrom.

The molded resin element 670 is composed of a material with a relatively low elasticity (e.g., PC resin, or ABS resin).

Figure 12:
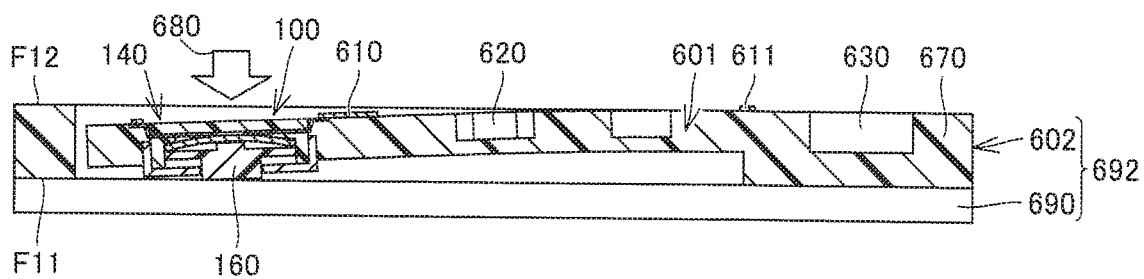
FIG. 12 is a cross-sectional view illustrating how the beam structure warps in the resin structure 600 when the beam structure is subject to pressure.
Figure 13:
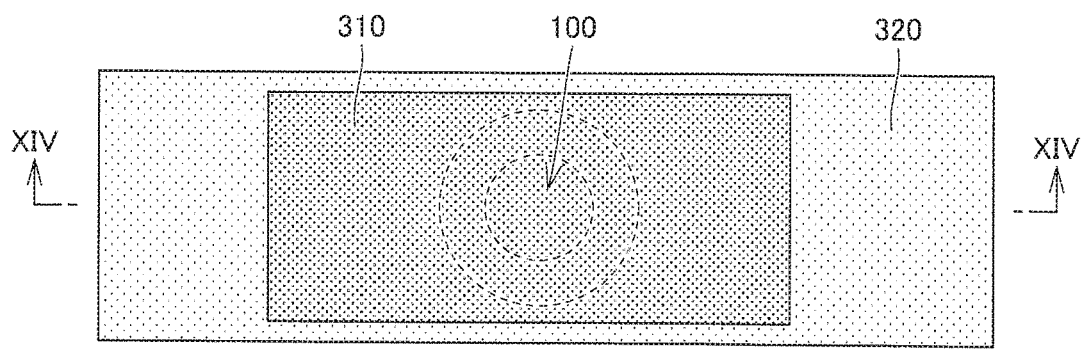
FIG. 13 is a top view for describing the typical package structure of a push-type switch.

FIG. 12 is a cross-sectional view illustrating how the beam structure warps when the beam structure is subject to pressure in the resin structure 600. Referring to FIG. 11, and FIG. 12, the resin structure 600 includes a contacting part 690, such as a battery or housing, and an electronic device 692.

The resin structure 600 includes a first outer surface F11 and a second outer surface F12 that faces the first outer surface F11; the button unit 160 is exposed from the first outer surface F11. The base 130 is placed closer to the second outer surface F12 than the button unit 160 in the resin structure 600. When the second outer surface F12 places a pressure 680 on the base portion of the beam structure 601 in the molded resin element 670, the beam structure 601 elastically deforms, which causes the base 130 to move from the second outer surface F12 toward the first outer surface F11. The beam structure 601 returns to its original state once the pressure 680 is removed.

The push-type switch 100 is embedded in, for instance, a polycarbonate (PC) molded resin element 670 so that the button unit 160 protrudes from the outer surface of the molded resin element 670 in the resin structure 600 as illustrated in FIG. 11. The push-type switch 100 is embedded where the molded resin element 670 warps and deforms when the pressure 680 is applied thereto. That is, the resin material used for the molded resin element in the second embodiment, e.g., PC, or ABS has a lower elasticity than the elastomer used in the first embodiment; therefore, it is the beam structure 601, which allows the molded resin element to warp, which creates and maintains the amount of movement (stroke) of the button unit 160 on the push-type switch 100.

As illustrated in FIG. 12, the resin structure 600 of the second embodiment is configured such that the push-type switch 100 embedded in the beam structure 601 of the molded resin element 670 may be subject to a pressure 680 causing the beam structure 601 to deform to a point where the button unit 160 touches and presses against a fixed contacting part 690, e.g., a battery, or the like. Here, the button unit 160 activates or deactivates the electrical conduction between the conductive wiring patterns 610, 611 on the outer surface of the molded resin element 670. The amount of warp of the beam structure 601 in the molded resin element 670 at this point may be adjusted by moving where the push-type switch 100 is embedded, or changing the resin thickness of the beam structure 601. And, the amount of warp of the beam structure 601 may be used to adjust the operational feel of the push-type switch.

While in this embodiment the beam structure provided in the molded resin element is cantilevered, the push-type switch 100 may be embedded at the center of the beam when the beam structure is such that the beam is supported at both ends.

All aspects of the embodiment disclosed should be considered merely examples and not limitations as such. The scope of the present invention is not limited to the above description, but to the scope of the claims, and is intended to include all equivalents and modifications allowable by the scope of the claims.

REFERENCE NUMERALS 1, 600 Resin structure
2, 692 Electronic device
100 Push-type switch
110, 111 Terminal
120 Cover
130 Base
150 Contact spring unit
160 Button unit
200 Printed circuit board
201 Conductive circuitry
210 Solder
310 Sheet material
320, 420, 670 Molded resin element
321 Hole
400, 680 Pressure
401, 402, 610, 611 Conductive wiring pattern
410, 690 Contacting part
430, 440, 620, 630 Electronic component
500 Temporary fixing film
510, 520 Die
511 Protrusion
530 Cavity
601 Beam structure
602 Support

The invention claimed is:

1. A resin structure comprising:
   a molded resin element; and
   a push-type switch; wherein
   the push-type switch comprises:
      a first terminal and a second terminal configured to connect to an electrical circuit;
      a receptacle to which the first and second terminal are secured;
      a button unit protruding from the receptacle; and
      a contact spring unit configured to move together with the button unit, to electrically connect between the first terminal and the second terminal, and to generate an opposing force relative to a pressure applied between the receptacle and the button unit;
   the receptacle is configured to store the button unit and the contact spring unit;
   the receptacle of the push-type switch is embedded in the molded resin element with the button unit exposed from the molded resin element;
   the molded resin element is composed of an elastic material;
   the resin structure comprises a first outer surface wherefrom the button unit is exposed, and a second outer surface facing the first outer surface; and
   the resin structure is configured to elastically deform in response to the receptacle receiving pressure from the second outer surface causing the receptacle to move from the second outer surface toward the first outer surface.

2. The resin structure according to claim 1, wherein the receptacle is embedded in the molded resin element so that the button unit is receded from the first outer surface which surrounds the button unit in the molded resin element.

3. The resin structure according to claim 1, wherein the molded resin element comprises:
   a beam structure; and
   a support supporting the beam structure, wherein
   the push-type switch is embedded in the beam structure of the molded resin element.

4. The resin structure according to claim 1, further comprising:
   an electronic component embedded in the molded resin element and configured for electrically connecting to the push-type switch; and
   a conductive wiring pattern formed on an outer surface of the molded resin element and configured to connect the electrical component and the first terminal.

5. An electronic device comprising:
   a resin structure according to claim 1; and
   a contacting part placed at the first outer surface of the molded resin element, wherein
   the molded resin element is configured to deform so that the button unit touches the contacting part in response to the receptacle receiving pressure from the second outer surface.

6. The electronic device according to claim 5, wherein the contacting part comprises a battery.

7. A method of manufacturing a resin structure with a push-type switch embedded in a molded resin element,
   the push-type switch comprising: a first terminal and a second terminal configured to connect to an electrical circuit; a receptacle whereon the first terminal and the second terminal are secured; a button unit protruding from the receptacle; and a contact spring unit configured to move with the button unit, to electrically connect between the first terminal and the second terminal, and to generate an opposing force relative to a pressure applied between the receptacle and the button unit,
   the receptacle configured to store the button unit and the contact spring unit,
   the method of manufacturing the resin structure comprising:
      placing the push-type switch in a mold with the mold pressing the button unit of the push-type switch toward the receptacle so that the button unit is separate from a cavity in response to the cavity being filled with resin; and
      injecting a resin into the cavity in the mold.

* * * * *